US009741903B2

(12) United States Patent
Jeong

(10) Patent No.: US 9,741,903 B2
(45) Date of Patent: Aug. 22, 2017

(54) LIGHT-EMITTING DEVICE AND LIGHT EMITTING DEVICE PACKAGE HAVING THE SAME

(71) Applicant: LG INNOTEK CO., LTD., Seoul (KR)

(72) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/317,034

(22) PCT Filed: Jun. 2, 2015

(86) PCT No.: PCT/KR2015/005522
§ 371 (c)(1),
(2) Date: Dec. 7, 2016

(87) PCT Pub. No.: WO2015/190735
PCT Pub. Date: Dec. 17, 2015

(65) Prior Publication Data
US 2017/0125642 A1    May 4, 2017

(30) Foreign Application Priority Data

Jun. 10, 2014 (KR) .................... 10-2014-0070291

(51) Int. Cl.
*H01L 29/06* (2006.01)
*H01L 31/0328* (2006.01)
(Continued)

(52) U.S. Cl.
CPC .......... *H01L 33/46* (2013.01); *H01L 33/0079* (2013.01); *H01L 33/06* (2013.01);
(Continued)

(58) Field of Classification Search
CPC .......... H01L 33/46; H01L 33/22; H01L 33/06
(Continued)

(56) References Cited

U.S. PATENT DOCUMENTS 7,928,464 B2 * 4/2011 Lee ..................... H01L 33/0079
257/99
7,956,376 B2 * 6/2011 Jeong ..................... H01L 33/42
257/79
(Continued)

FOREIGN PATENT DOCUMENTS

KR   10-2009-0072644   7/2009
KR   10-2010-0044726   4/2010
(Continued)

OTHER PUBLICATIONS

International Search Report (with English translation) and Written Opinion dated Sep. 7, 2015 issued in Application No. PCT/KR2015/005522.

*Primary Examiner* — David S Blum
(74) *Attorney, Agent, or Firm* — KED & Associates, LLP

(57) ABSTRACT

The light-emitting element provides: a light-emitting structure, which comprises a first conductive semiconductor layer, an active layer under the first conductive semiconductor layer, and a second conductive semiconductor layer under the active layer. A first electrode is disposed under a first region under the light-emitting structure and electrically connected to the second conductive semiconductor layer; a second electrode disposed under a second region under the light-emitting structure and electrically connected to the first conductive semiconductor layer. A connection electrode is connected the second electrode with the first conductive semiconductor layer. An insulating layer is disposed between the first and second electrodes; a first protective layer is disposed around the lower circumference of the light-emitting structure; and a second protective layer is disposed between the insulating layer and the light-emitting structure.

20 Claims, 12 Drawing Sheets

(51) Int. Cl.
*H01L 31/0336* (2006.01)
*H01L 31/072* (2012.01)
*H01L 31/109* (2006.01)
*H01L 31/00* (2006.01)
*H01L 33/46* (2010.01)
*H01L 33/22* (2010.01)
*H01L 33/06* (2010.01)
*H01L 33/32* (2010.01)
*H01L 33/40* (2010.01)
*H01L 33/62* (2010.01)
*H01L 33/00* (2010.01)
*H01L 33/64* (2010.01)
*H01L 33/56* (2010.01)
*H01L 33/50* (2010.01)

(52) U.S. Cl.
CPC .............. *H01L 33/22* (2013.01); *H01L 33/32* (2013.01); *H01L 33/405* (2013.01); *H01L 33/502* (2013.01); *H01L 33/56* (2013.01); *H01L 33/62* (2013.01); *H01L 33/647* (2013.01); *H01L 2933/0016* (2013.01); *H01L 2933/0025* (2013.01); *H01L 2933/0066* (2013.01)

(58) Field of Classification Search
USPC ..................................................... 257/13, 98
See application file for complete search history.

(56) References Cited

U.S. PATENT DOCUMENTS

| | | |
|---|---|---|
| 2004/0263071 A1 | 12/2004 | Anandan et al. |
| 2010/0096652 A1 | 4/2010 | Choi et al. |
| 2011/0101406 A1 | 5/2011 | Heo et al. |
| 2011/0186892 A1* | 8/2011 | Jeong .................. H01L 33/0079 257/98 |
| 2013/0161669 A1 | 6/2013 | Chen et al. |
| 2014/0054543 A1 | 2/2014 | Jeong |
| 2015/0263230 A1 | 9/2015 | Katsuno et al. |

FOREIGN PATENT DOCUMENTS

| | | |
|---|---|---|
| KR | 10-2011-0046711 | 5/2011 |
| KR | 10-2012-0031473 | 4/2012 |
| KR | 10-2012-0128084 | 11/2012 |
| KR | 10-2014-0025025 | 3/2014 |

* cited by examiner

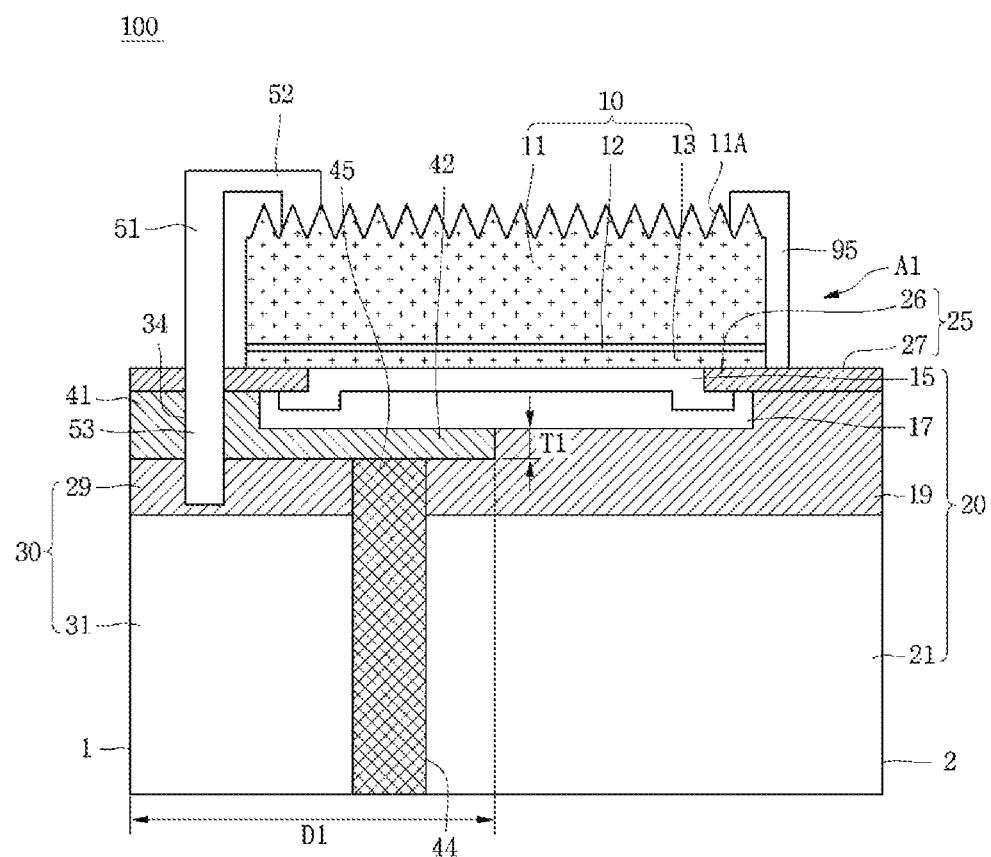
[FIG. 1]

[FIG. 2]
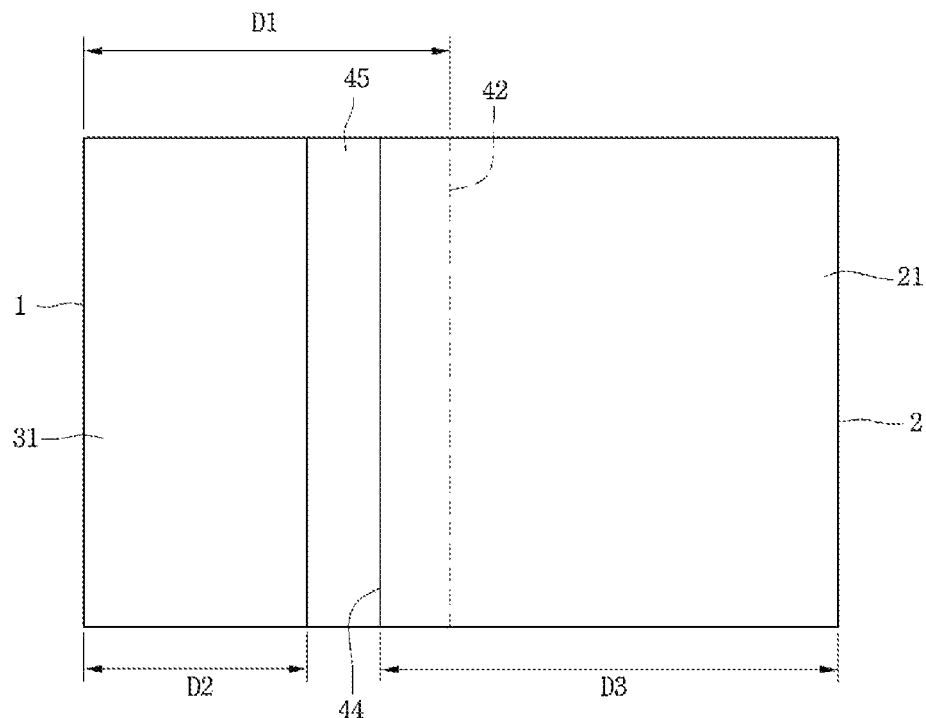
[FIG. 3]
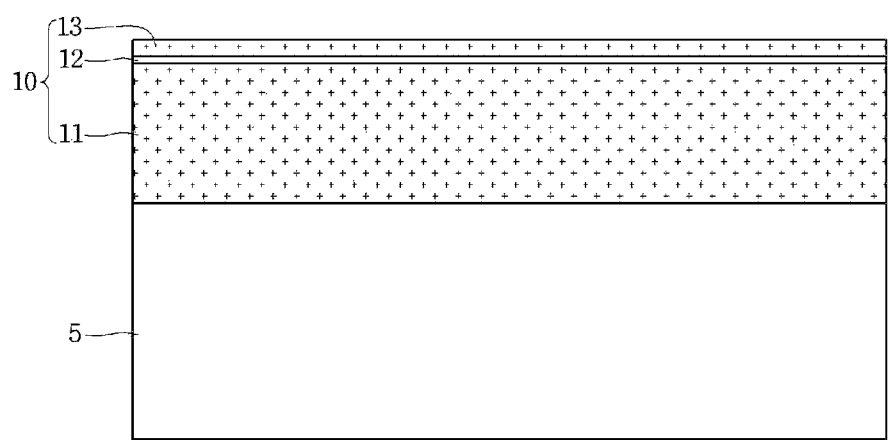

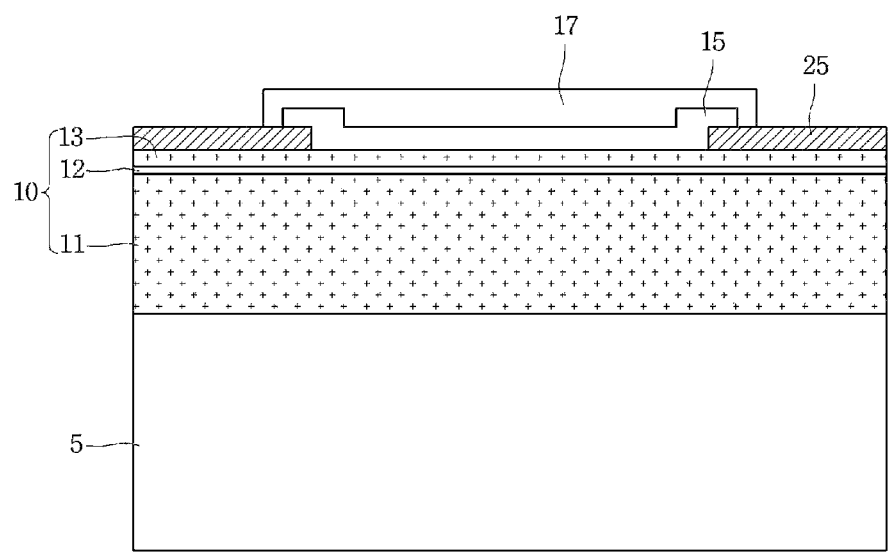
[FIG. 4]

[FIG. 5]
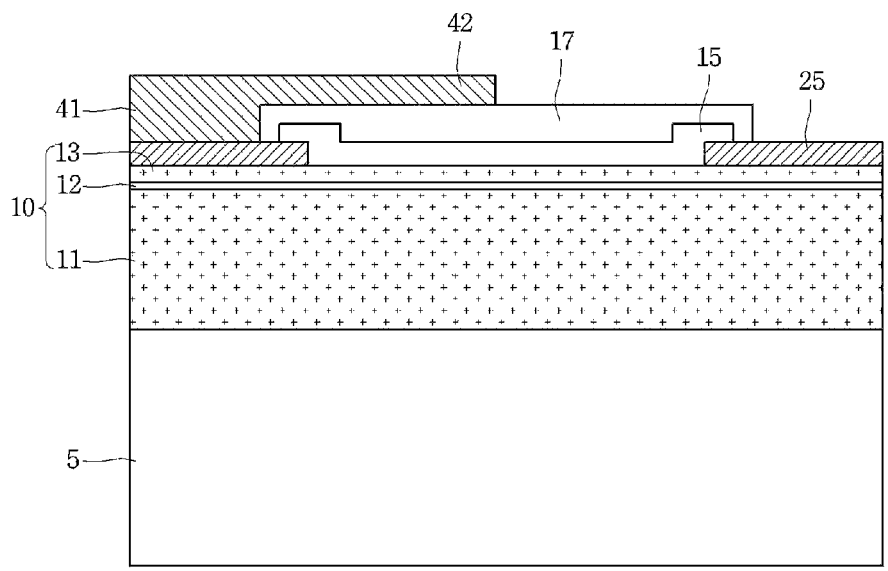
[FIG. 6]
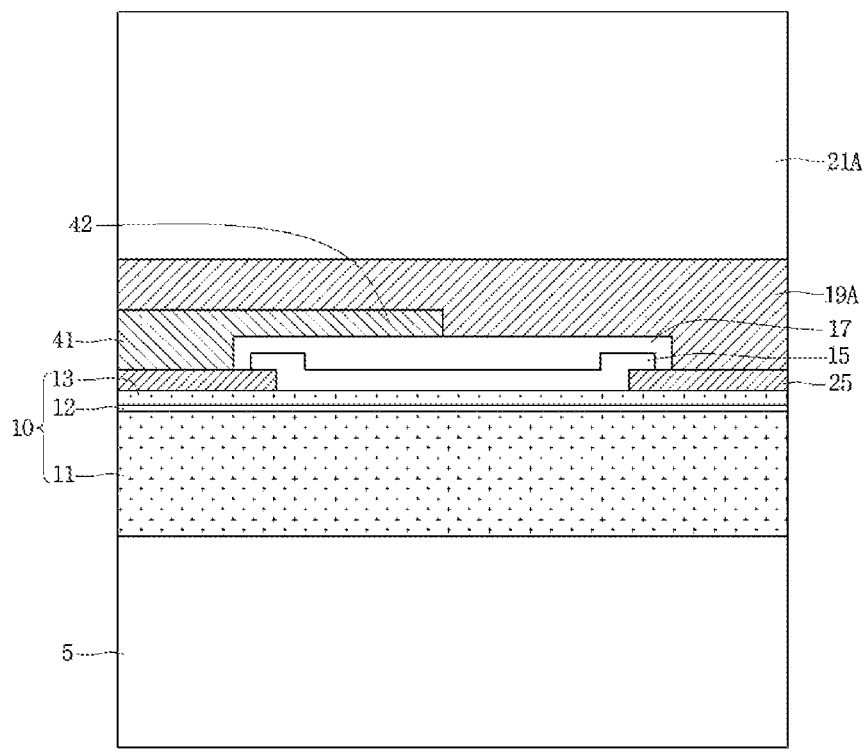

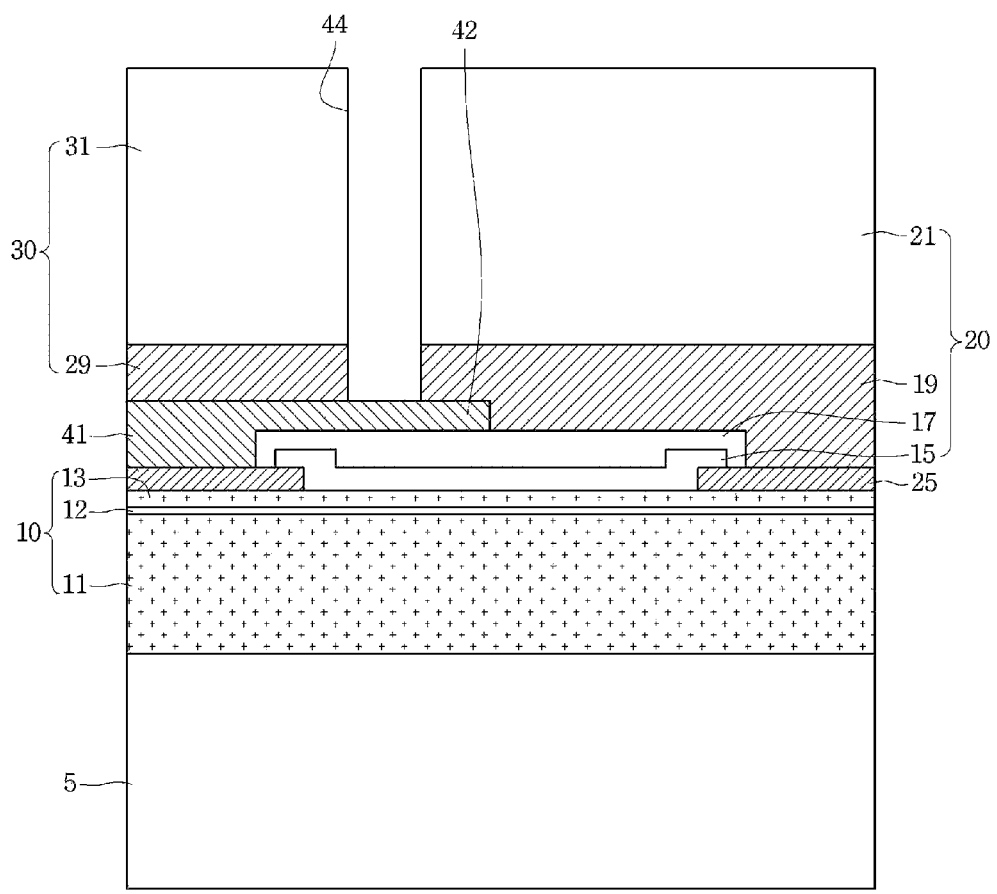
[FIG. 7]

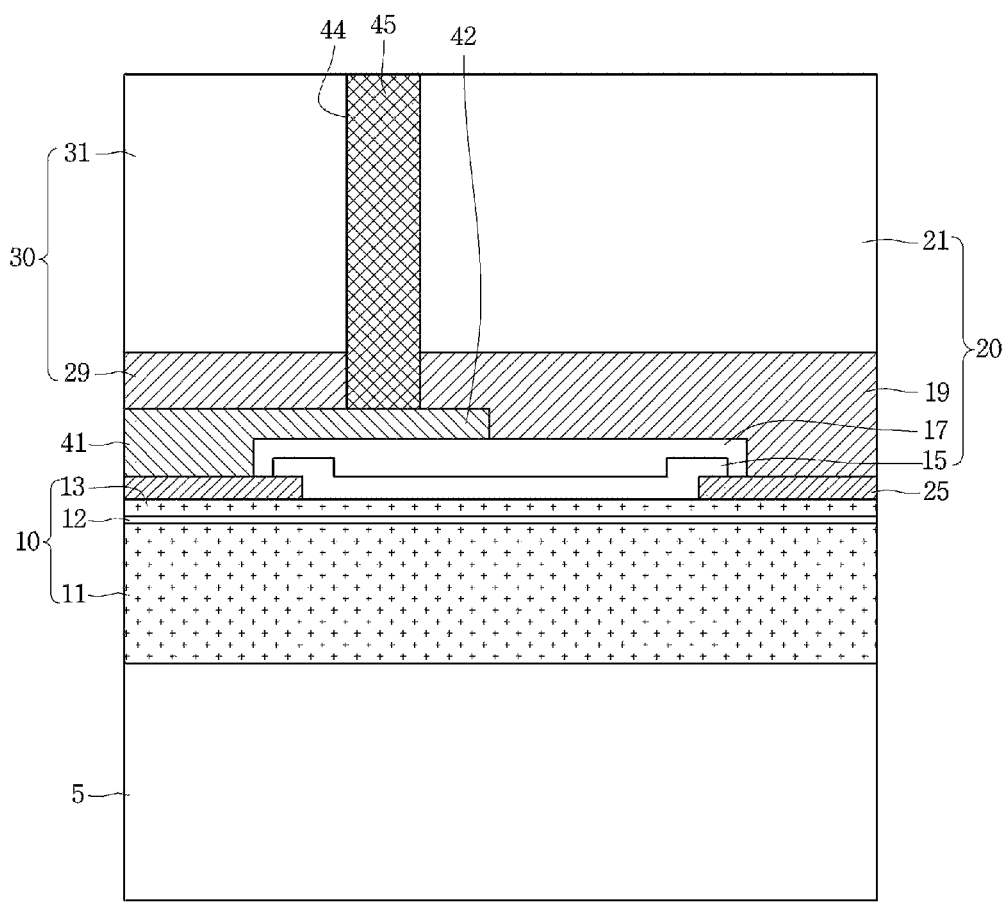
[FIG. 8]

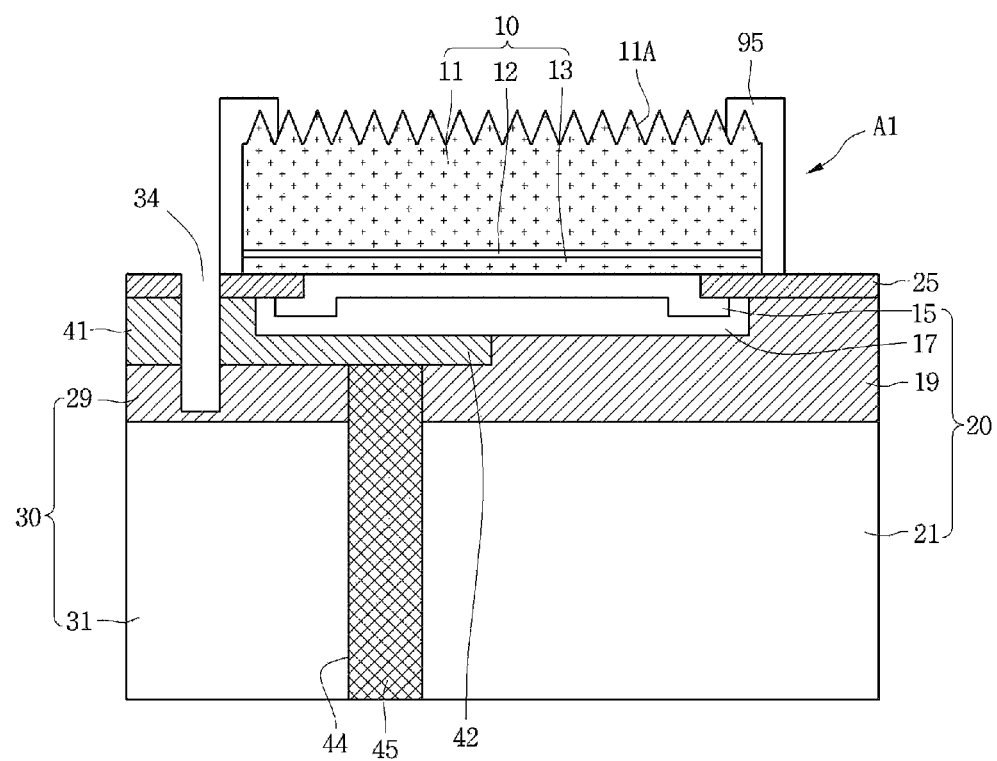
[FIG. 9]

[FIG. 10]
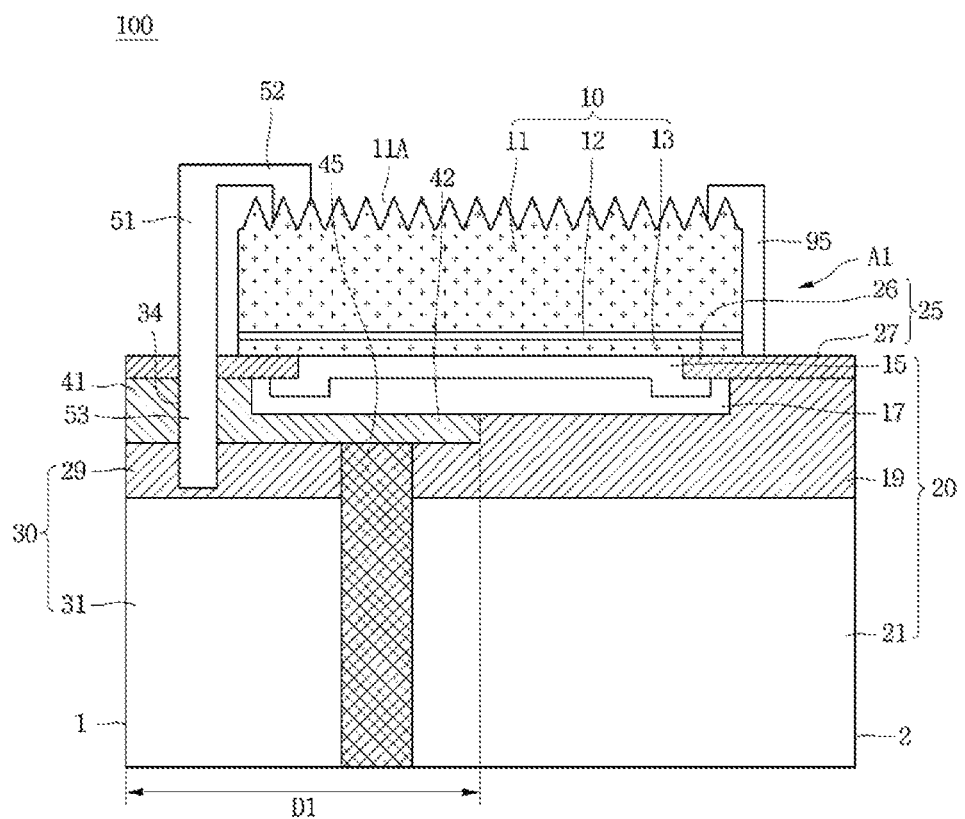

[FIG. 11]
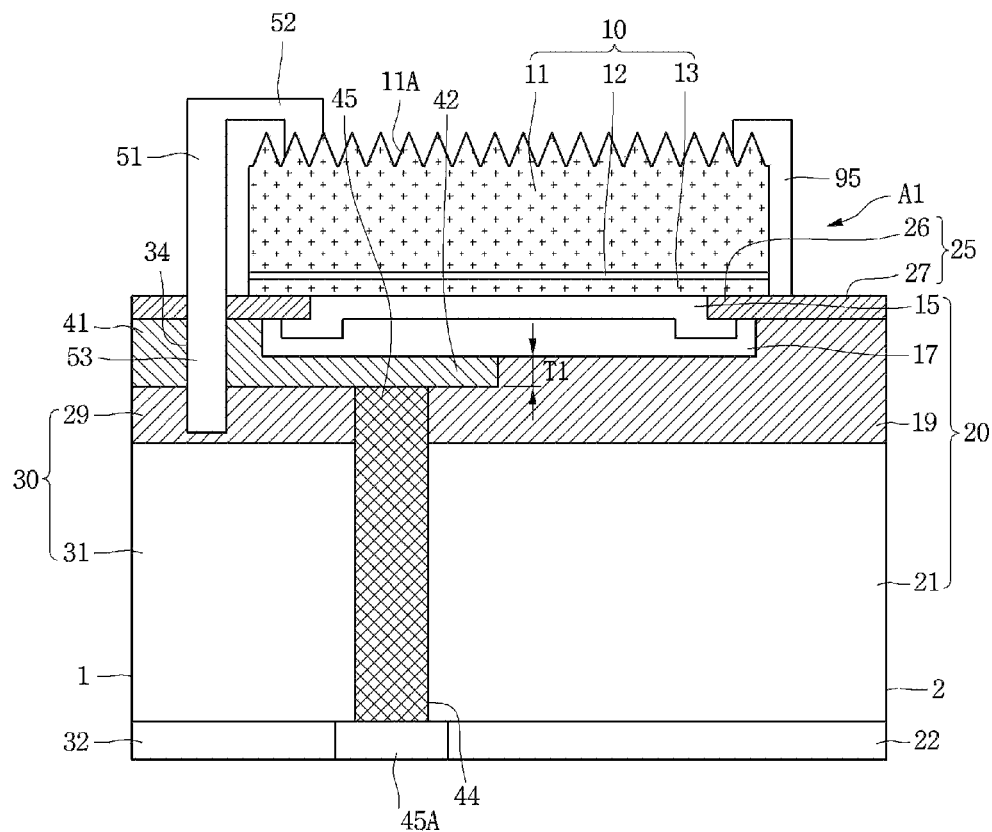

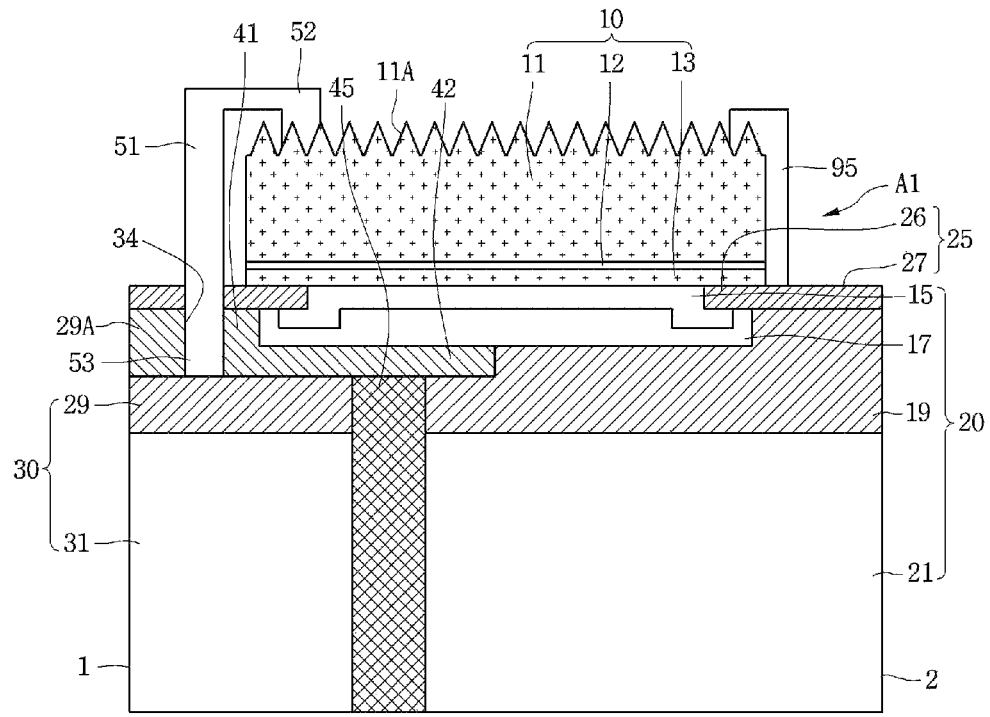
[FIG. 12]
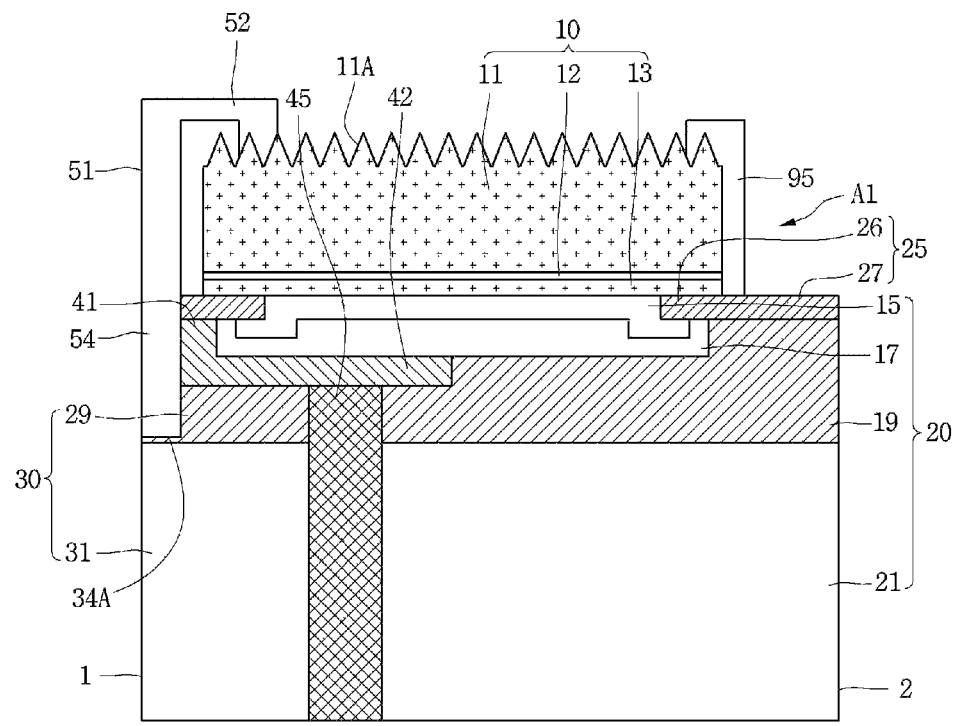
[FIG. 13]

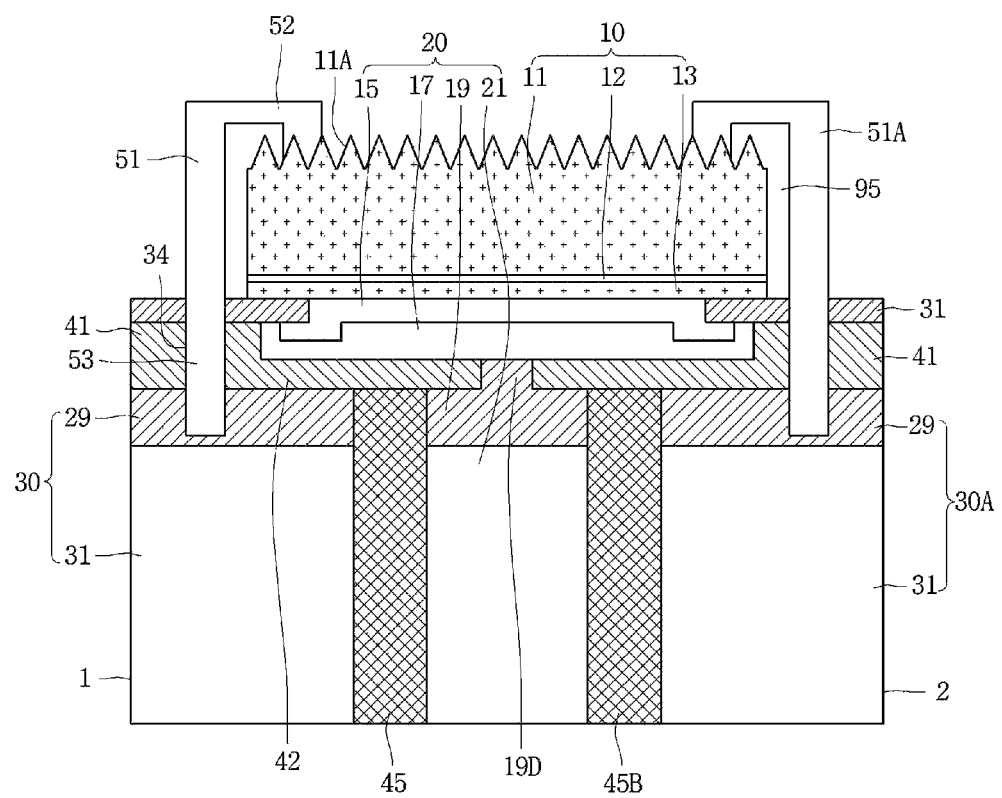
[FIG. 14]

[FIG. 15]
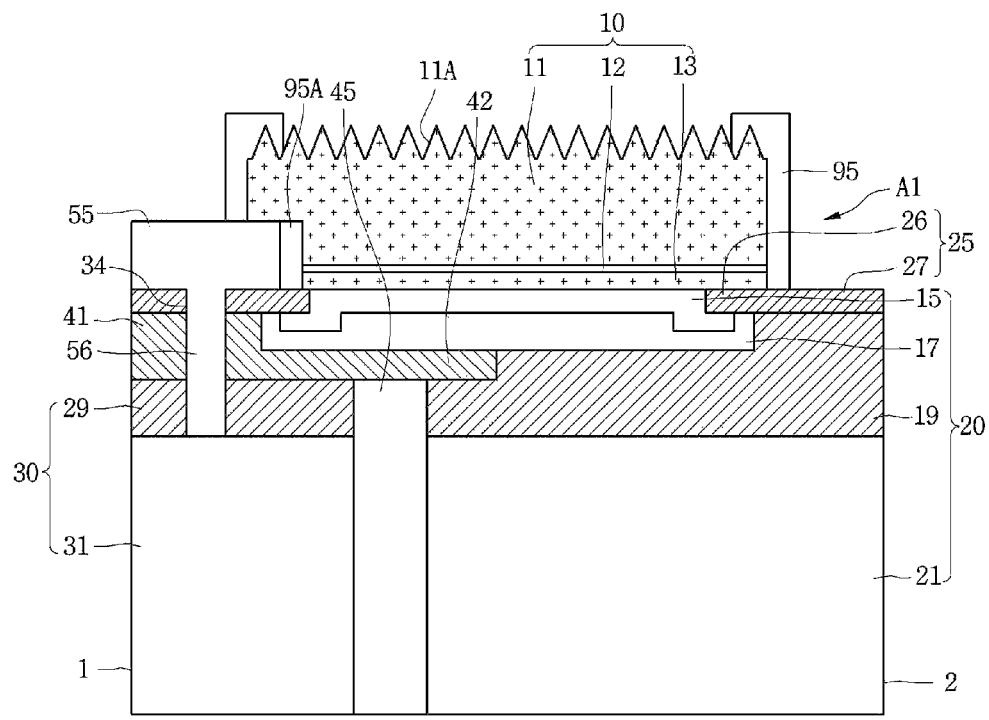
[FIG. 16]
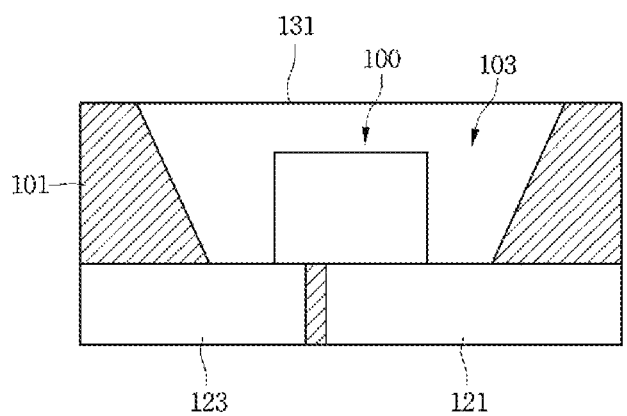

LIGHT-EMITTING DEVICE AND LIGHT EMITTING DEVICE PACKAGE HAVING THE SAME

CROSS-REFERENCE TO RELATED PATENT APPLICATIONS

This application is a U.S. National Stage Application under 35 U.S.C. §371 of PCT Application No. PCT/KR2015/005522, filed Jun. 2, 2015, which claims priority to Korean Patent Application No. 10-2014-0070291, filed Jun. 10, 2014, whose entire disclosures are hereby incorporated by reference.

TECHNICAL FIELD

Embodiments relate to a light emitting device.
Embodiments relate to a light emitting device package having the light emitting device.

BACKGROUND ART

As one type of a light emitting device, LEDs (Light Emitting Diodes) have been widely employed. The LED may function to convert an electrical signal to a light-beam such as infrared, visible, and ultraviolet rays using properties of a compound semiconductor.

As light-beam efficiency of the light emitting device increases, the light emitting device has a variety of applications such as a display device, an illustration device, etc.

DISCLOSURE

Technical Problem

Embodiments provide a light emitting device where an electrode connected to a top surface of a first conductive-type semiconductor layer is die-bonded.

Embodiments provide a light emitting device having a plurality of electrodes disposed under a light emitting structure and connected to first and second conductive-type semiconductor layers of the light emitting structure.

Technical Solution

According to the embodiment, there is provided a light emitting device comprising: a light emitting structure comprising a first conductive-type semiconductor layer, an active layer under the first conductive-type semiconductor layer, and a second conductive-type semiconductor layer under the active layer; a first electrode disposed under a first region of a bottom surface of the light emitting structure and is electrically connected to the second conductive-type semiconductor layer; a second electrode disposed under a second region of the bottom surface of the light emitting structure and electrically connected to the first conductive-type semiconductor layer; a connection electrode electrically connected between the second electrode and the first conductive-type semiconductor layer; an insulating layer disposed between the first and second electrodes; a first protective layer disposed around an outer periphery of the bottom surface of the light emitting structure; and a second protective layer disposed between the insulating layer and the light emitting structure, wherein the second protective layer is disposed on the insulating layer and has a width larger than a width of the insulating layer.

According to the embodiment, there is provided a light emitting device comprising: a light emitting structure comprising a first conductive-type semiconductor layer, an active layer under the first conductive-type semiconductor layer, and a second conductive-type semiconductor layer under the active layer; a contact layer disposed under the second conductive-type semiconductor layer; a reflection layer disposed under the contact layer; a first bonding layer disposed under a first region of a bottom surface of the reflection layer and electrically connected to the reflection layer; a second bonding layer disposed under a second region of the bottom surface of the reflection layer and spaced from the first bonding layer and the reflection layer; a first protective layer disposed between the reflection layer and the second bonding layer; a first conductive support member disposed under the first bonding layer; a second conductive support member disposed under the second bonding layer; and a connection electrode electrically connected between the second bonding layer and the first conductive-type semiconductor layer, wherein the first and second supports have different widths and the same thickness.

Advantageous Effects

In one aspect of the present disclosure, there is provided a light emitting device package having the above-defined light emitting device.

In accordance with the present disclosure, the light emitting structure may be powered via the plurality of conductive supports disposed under the light emitting structure, thereby to improve the heat-dissipation efficiency.

In accordance with the present disclosure, the light emitting device may be bonded via the conductive supports disposed under the light emitting structure, thereby to facilitate separation between the cathode and anode of the light emitting device.

In accordance with the present disclosure, the cathode and anode of the light emitting device may be effectively isolated from each other.

DESCRIPTION OF DRAWINGS

FIG. 1 is a cross-sectional view of a light emitting device in accordance with a first embodiment.

FIG. 2 is a bottom view of a light emitting device in FIG. 1.

FIG. 3 to FIG. 10 illustrates cross-sectional views of various stages of a method for manufacturing the light emitting device in FIG. 1.

FIG. 11 is a side cross-sectional view of a light emitting device in accordance with a second embodiment.

FIG. 12 is a side cross-sectional view of a light emitting device in accordance with a third embodiment.

FIG. 13 is a side cross-sectional view of a light emitting device in accordance with a fourth embodiment.

FIG. 14 is a side cross-sectional view of a light emitting device in accordance with a fifth embodiment.

FIG. 15 is a side cross-sectional view of a light emitting device in accordance with a sixth embodiment.

FIG. 16 is a side cross-sectional view of a light emitting device package in accordance with an embodiment.

BEST MODE

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. Spatially relative terms, such as "beneath," "below," "lower," "under," "on," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "on" the other elements or features. Thus, the example terms "below" and "under" can encompass both an orientation of on and below.

Hereinafter, light emitting devices, light emitting device packages including the same, and methods for manufacturing the same in accordance with various embodiments will be described in details with reference to the accompanying drawings.

FIG. 1 is a cross-sectional view of a light emitting device in accordance with a first embodiment.

Referring to FIG. 1, a light emitting device 100 may include a light emitting structure 10, a first electrode 20 disposed under a first region of the light emitting structure 10, a second electrode 30 disposed under a second region of the light emitting structure 10, and a connection electrode 51 connected to the light emitting structure 10.

The light emitting structure 10 may include a first conductive-type semiconductor layer 11, an active layer 12 under the first conductive-type semiconductor layer 11, and a second conductive-type semiconductor layer 13 under the active layer 12. The active layer 12 may be disposed between the first conductive-type semiconductor layer 11 and the second conductive-type semiconductor layer 13. The active layer 12 may contact the first conductive-type semiconductor layer 11 and the second conductive-type semiconductor layer 13.

In one example, the first conductive-type semiconductor layer 11 may include an n-type semiconductor layer with a doped n-type dopant as a first conductive-type dopant. The second conductive-type semiconductor layer 13 may include a p-type semiconductor layer with a doped p-type dopant as a second conductive-type dopant. In another example, the first conductive-type semiconductor layer 11 may include a p-type semiconductor layer, while the second conductive-type semiconductor layer 13 may include an n-type semiconductor layer.

The first conductive-type semiconductor layer 11 may include, for example, an n-type semiconductor layer. The first conductive-type semiconductor layer 11 may include a semiconductor material with a composition of $In_xAl_yGa_{1-x-y}N$ $0 \le x \le 1$, $0 \le y \le 1$, $0 \le x+y \le 1$. The first conductive-type semiconductor layer 11 may include, for example, at least one selected from a group consisting of GaN, AlN, AlGaN, InGaN, InN, InAlGaN, AlInN, AlGaAs, GaP, GaAs, GaAsP, AlGaInP, etc. Further, Si, Ge, Sn, Se, Te, etc. as an n-type dopant may be doped into the first conductive-type semiconductor layer. The first conductive-type semiconductor layer 11 may have an unevenness 11A at top surface thereof. The unevenness 11A may improve light extraction.

The second conductive-type semiconductor layer 13 may be made of, for example, a p-type semiconductor layer. The second conductive-type semiconductor layer 13 may be made of a semiconductor material with a composition of $In_xAl_yGa_{1-x-y}N$ $0 \le x \le 1$, $0 \le y \le 1$, $0 \le x+y \le 1$. The second conductive-type semiconductor layer 13 may include, for example, at least one selected from a group consisting of GaN, AlN, AlGaN, InGaN, InN, InAlGaN, AlInN, AlGaAs, GaP, GaAs, GaAsP, AlGaInP etc. Mg, Zn, Ca, Sr, Ba, etc. as a p-type dopant may be doped into the second conductive-type semiconductor layer 13. The second conductive-type semiconductor layer 13 may have a thickness smaller than that of the first conductive-type semiconductor layer 11. The second conductive-type semiconductor layer 13 may have a width larger than that of the first conductive-type semiconductor layer 11. However, the present disclosure is not limited thereto.

The active layer 12 may refer to a layer in which an electron (or hole) injected from the first conductive-type semiconductor layer 11 encounters a hole (or electron) injected from the second conductive-type semiconductor layer 13, thereby to emit light beams based on an energy band of a material of the active layer 12. The active layer 12 may include any one of a single quantum well, a multi quantum well, a quantum dot, or a quantum wire. However, the present disclosure is not limited thereto. The active layer 12 may have a thickness smaller than the first conductive-type semiconductor layer 11.

The active layer 12 may be made of a semiconductor material with a composition of, for example, $In_xAl_yGa_{1-x-y}N$ $0 \le x \le 1$, $0 \le y \le 1$, $0 \le x+y \le 1$. When the active layer 12 may include a multi quantum well, the active layer 12 may be embodied as vertical alternations of a plurality of well layers and a plurality of barrier layers. For example, a pair of a well layer/barrier layer may include InGaN/GaN, InGaN/AlGaN, InGaN/InGaN, GaN/AlGaN, InAlGaN/InAlGaN, AlGaAs/GaAs, InGaAs/GaAs, InGaP/GaP, AlInGaP/InGaP, or InP/GaAs.

In another example, the first conductive-type semiconductor layer 11 may include a p-type semiconductor layer, while the second conductive-type semiconductor layer 13 may include an n-type semiconductor layer. On the first conductive-type semiconductor layer 13, a further semiconductor layer (not shown) made of an n-type or p-type semiconductor layer may be formed. In this way, the light emitting structure 10 may be disposed of at least one of n-p, p-n, n-p-n, and p-n-p junctions. Impurities doping concentrations in the first conductive-type semiconductor layer 11 and the second conductive-type semiconductor layer 13 may be uniform or non-uniform. That is, the light emitting structure 10 may be various. Thus, the present disclosure is not limited thereto.

Further, between the first conductive-type semiconductor layer 11 and the active layer 12 or between the second conductive-type semiconductor layer 13 and the active layer 12, a first conductive-type InGaN/GaN super lattice structure or InGaN/InGaN super lattice structure may be formed. Further, between the second conductive-type semiconductor layer 13 and the active layer 12, a second conductive-type AlGaN layer may be formed, for example, p-type AlGaN.

The first electrode 20 may be disposed under the first region of the light emitting structure 10, and the second electrode 30 may be disposed under the second region the light emitting structure 10. Thus, the first and second electrodes 20 and 30 may be disposed under the light emitting structure 10 in the different regions thereof.

An insulating layer 45 may be disposed between the first electrode 20 and second electrode 30. The insulating layer 45 may allow electrical isolation between the first electrode 20 and second electrode 30. The insulating layer 45 may have a higher level than the first support member 21. The insulating layer 45 may include any one selected from a group of consisting of silicon, SiO2, SiOx, SiOxNy, Si3N4, Al2O3, TiO2 or AlN.

The first electrode 20 may be disposed under the second conductive-type semiconductor layer 13 and may be electrically connected to the second conductive-type semiconductor layer 13. The second electrode 30 may be partially disposed under the first electrode 20 and may be electrically connected to the first conductive-type semiconductor layer 11. The first electrode 20 may act as, for example, an anode terminal, while the second electrode 30 may act as, for example, a cathode terminal.

The first electrode 20 may include a contact layer 15, a reflection layer 17, a first bonding layer 19 and a first support member 21. The second electrode 30 may be spaced from the first electrode 20 and may include a second bonding layer 29 and second support member 31. The second bonding layer 29 and second support member 31 of the second electrode 30 may not vertically overlap the first bonding layer 19 and first support member 21.

The contact layer 15 may include, for example, a transparent material. The contact layer 15 may be formed of, for example, at least one of a conductive oxide film and a conductive nitride film. The contact layer 15 may include, for example, at least one selected from a group consisting of ITO (Indium Tin Oxide), ITON (ITO Nitride), IZO (Indium Zinc Oxide), IZON (IZO Nitride), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO. The contact layer 15 may include a metal material, for example, at least one selected from a group consisting of Ag, Ni, Rh, Pd, Pt, Hf, In, and Zn. The contact layer 15 may be disposed under the second conductive-type semiconductor layer 13 and may contact the second conductive-type semiconductor layer 13. The contact layer 15 may contact, for example, ohmic-contact the second conductive-type semiconductor layer 13. The contact layer 15 may be removed. Thus, the present disclosure is not limited thereto.

The reflection layer 17 may include a metal material with high reflection. For example, the reflection layer 17 may include a metal or alloy thereof, for example, at least one selected from a group consisting of Ag, Ni, Al, Rh, Pd, Ir, Ru, Mg, Zn, Pt, Cu, Au, and Hf. Further, the reflection layer 17 may be formed of a stack of a first layer of the metal or alloy thereof and a second layer made of a light-transparent conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), ATO (Antimony-Tin-Oxide), etc. Alternatively, the reflection layer 17 may include at least one selected from a group consisting of Ag, Al, Ag—Pd—Cu alloy, or Ag—Cu alloy thereof.

The reflection layer 17 may have a width larger than that of the contact layer 15. The reflection layer 17 may have a width equal to or larger than 70% of a width of a bottom surface of the light emitting structure 10. The reflection layer 17 may improve light reflection. The reflection layer 17 may be disposed under the contact layer 15 and may be electrically connected to the contact layer 15. In another example, the reflection layer 17 may partially a bottom surface of the light emitting structure 10.

The reflection layer 17 may act to reflect light beams incident from the light emitting structure 10 to increase a light beam level toward the outside of the present light emitting device. The reflection layer 17 may be formed of a single or multiple layers.

The first bonding layer 19 may be disposed under the reflection layer 17. The first bonding layer 19 may be disposed between the reflection layer 17 and the first support member 21. Between the first bonding layer 19 and the reflection layer 17, a barrier layer (not shown) may further be formed. The barrier layer may act to prevent a metal material from diffusing toward the reflection layer 17.

The first bonding layer 19 may be formed of a single or multiple layers. The first bonding layer 19 may include at least one metal selected from a group consisting of, for example, Ti, Au, Sn, Ni, Cr, Ga, In, Bi, Cu, Ag, Nb, Pt, W, V, Fe, Mo, Pd or Ta. The first bonding layer 19 may include a seed layer made of, for example, Ni, Pt, Ti, W, V, Fe, or Mo. The first support member 21 may support the above-listed layers. The first support member 21 maybe electrically connected to an external electrode to supply a power to the light emitting structure 10. The first support member 21 may include a conductive material.

The first support member 21 may include, for example, Ti, Cr, Ni, Al, Pt, Au, W, Cu, Mo, Cu—W or an alloy of at least two thereof. The first support member 21 may be formed of an impurities-doped semiconductor substrate (e.g., Si, Ge, GaN, GaAs, ZnO, SiC, SiGe, etc. substrate). The first support member 21 may have a thickness larger than that of the first bonding layer 19 and that of the light emitting structure 10. The first support member 21 may have a thickness equal to or larger than 30 μm, for example, a thickness of 100 μm to 500 μm. When the first support member 21 has a thickness smaller than the above defined range, it may have poor supporting and heat-dissipation abilities. To the contrary, when the first support member 21 has a thickness larger than the above defined range, it may increase an overall thickness of the light emitting device.

A first protective layer 25 may be disposed between and around the light emitting structure 10 and first electrode 20. The first protective layer 25 may include an inner protective layer 26 contacting a bottom surface of the second conductive-type semiconductor layer 13 on an outer region thereof, and an outer protective layer 27 protruding horizontally beyond the light emitting structure 10. The inner protective layer 26 of the first protective layer 25 may contact the contact layer 15 and the reflection layer 17. For example, a bottom surface of the inner protective layer 26 of the first protective layer 25 may contact an outer portion of the contact layer 15 and an outer portion of the reflection layer 17. The outer protective layer 27 of the first protective layer 25 may contact a top surface of the first bonding layer 19 on an outer region thereof. The outer protective layer 27 of the first protective layer 25 may be exposed in an outer region A1 of the light emitting structure 10.

The first protective layer 25 may have an open region. In the open region of the first protective layer 25, the contact layer 15 may be disposed. The first protective layer 25 may be disposed around the contact layer 15. A top and/or bottom surface of the first protective layer 25 may have a roughness. However, the present disclosure is not limited thereto.

The first protective layer 25 may include a metal oxide or metal nitride. The first protective layer 25 may include at least one selected from a group consisting of, for example, SiO2, SiOx, SiOxNy, Si3N4, Al2O3, TiO2, and AlN. The first protective layer 25 may include an insulating material. The first protective layer 25 may be defined as a channel layer to protect the light emitting structure 10 on the outer bottom surface thereof. However, the present disclosure is not limited thereto.

The second electrode 30 may be disposed under a second region of the second conductive-type semiconductor layer 13 of the light emitting structure 10. The second protective layer 41 may be disposed between the second electrode 30 and the first protective layer 25. The second protective layer 41 may be disposed between the light emitting structure 10 and the insulating layer 45. The second protective layer 41 may include an insulating material and may be disposed under the first protective layer 25. The second protective layer 41 may contact the reflection layer 17. The second protective layer 41 may have an extension part 42 to partially extend under the reflection layer 17. The second protective layer 41 may have the extension part 42 to extend between the reflection layer 17 and first bonding layer 19 of the first electrode 20. The second protective layer 41 may have the extension part 42 to contact the reflection layer 17 and first bonding layer 19 of the first electrode 20.

Referring to FIG. 1 and FIG. 2, the second protective layer 41 may have a width D1 of a bottom surface larger than a width D2 of a bottom surface of the second support member 31. In this way, a recess 44 may be easily in which the insulating layer 45 may be filled. The second protective layer 41 may have the width D1 of the bottom surface smaller than a width D3 of a bottom surface of the first support member 21. A bottom surface area of the second protective layer 41 may be larger than the bottom surface area of the second support member 31. In this way, an electrical property and heat-dissipation property of the first support member 21 may not be prevented from deteriorating.

The second protective layer 41 may be partially disposed on the insulating layer 45 and may have a width larger than that of the insulating layer 45. For example, the second protective layer 41 may have a bottom surface width D1 larger than a width of the insulating layer 45.

The second protective layer 41 may include the same material or different material as or from the first protective layer 25. The second protective layer 41 may include at least one of SiO2, SiOx, SiOxNy, Si3N4, Al2O3, and TiO2. In one example, the second protective layer 41 may be formed of a reflection structure as a stack of dielectric layers with different refractive indexes, for example, DBR (Distributed Bragg reflector). In one example, the second protective layer 41 may be formed of a stack structure, for example, SiO2/Al2O3, SiO2/TiO2, or Al2O3/TiO2. In one example, the second protective layer 41 may be formed of an insulating reflection layer or non-transparent layer. The second protective layer 41 may act to reflect a laser having a specific wavelength when the recess 44 is disposed between the first and second support members 21 and 31. In this way, the second protective layer 41 may protect the contact layer 15, the reflection layer 17 and the light emitting structure 10. A thickness of the extension part 42 of the second protective layer 41 or a thickness between the second electrode 30 and the reflection layer 17 may be in a range of 50 nm to 2000 nm. This thickness range may act to block a passage of a laser having a specific wavelength. The laser wavelength may be selected depending on a material and thickness of the above-disclosed metal.

The second electrode 30 may be disposed under the second protective layer 41. The second electrode 30 may include the second bonding layer 29 and second support member 31. The second bonding layer 29 may be disposed under the second protective layer 41, and may contact the second protective layer 41. The second bonding layer 29 may include the same material as the first bonding layer 19. The second support member 31 may be disposed under the second bonding layer 29. The second support member 31 may include the same material as the first support member 21. The first and second support members 21 and 31 may have the same thickness. However, the present disclosure is not limited thereto.

The insulating layer 45 may extend from the second protective layer 41 to a bottom surface of the first and second support members 21 and 31. The insulating layer 45 may contact the second protective layer 41 on a bottom surface thereof. The insulating layer 45 may be sandwiched between the first and second bonding layers 19 and 29. Thus, the insulating layer 45 may fill the recess 44 defined between the first and second support members 21 and 31. The recess 44 may vertically extend from a top level of the first and second bonding layer 19 and 29 to a bottom level of the first and second support members 21 and 31. The insulating layer 45 may act to allow electrical isolation between the first and second electrodes 20 and 30. The insulating layer 45 may be closer to a first side wall 1 of the second support member 31 than a second side wall 2 of the first support member 21. The side walls 1 and 2 may be opposite to each other. This may prevent heat-dissipation property of the first support member 21 from being lowered.

In another example, the insulating layer 45 may pass through the extension part 42 of the second protective layer 41 to contact the reflection layer 17. However, the present disclosure is not limited thereto.

A third protective layer 95 may be partially disposed on a surface of the light emitting structure 10. The third protective layer 95 may be partially disposed on a side surface and a top surface of the light emitting structure 10. To be specific, the third protective layer 95 may be partially disposed on a top surface of the first conductive-type semiconductor layer 11. A bottom of the third protective layer 95 may contact a top of the first protective layer 25. The top of the third protective layer 95 may be at least partially or completely disposed on a top surface of the first conductive-type semiconductor layer 11. The third protective layer 95 may include an insulating material. For example, the third protective layer 95 may include one selected from SiO2, SiOx, SiOxNy, Si3N4, Al2O3, TiO2 or AlN.

The connection electrode 51 may allow an electrical connection between the second electrode 30 and the first conductive-type semiconductor layer 11. The connection electrode 51 may be disposed in the second electrode 30 region so as to surround the third protective layer 95. The connection electrode 51 may have a first contact 52 and a second contact 53. The first contact 52 may partially contact the first conductive-type semiconductor layer 11 on a top surface thereof. The second contact 53 may contact the second bonding layer 29. The connection electrode 51 may have a vertical portion to pass through the first protective layer 25, second protective layer 41 and second bonding layer 29. In other words, an electrode recess 34 may be disposed to pass through the first protective layer 25, second protective layer 41 and second bonding layer 29. Then, the connection electrode 51 may fill the electrode recess 34. Thus, the connection electrode 51 may contact the first protective layer 25 and second protective layer 41. The connection electrode 51 may allow an electrical connection between the second support member 31 and first conductive-type semiconductor layer 11. The connection electrode 51 may include at least one of Cr, Ti, Ni, W, Pt, Al, and Au. The connection electrode 51 may be disposed of a single or multiple layers.

The first and second support members 21 and 31 of the light emitting device 100 may be bonded to a board (PCB). In accordance with the first embodiment, since the first and second electrodes 20 and 30 are disposed under the light emitting structure 10 and are spaced from each other, the light emitting device 100 may be bonded to the board via the first and second support members 21 and 31 thereof. Further, since the light emitting device 100 may be bonded to the board (PCB) via the first and second support members 21 and 31, it may dispense with a separate wire. Alternately, the light emitting device 100 may be bonded to the board (PCB) via the second support member 31 while a wire is bonded to the first contact 52 of the connection electrode 51.

FIG. 3 to FIG. 10 illustrates cross-sectional views of various stages of a method for manufacturing the light emitting device in FIG. 1.

Referring to FIG. 3, on a substrate 5, the first conductive-type semiconductor layer 11, active layer 12, and second conductive-type semiconductor layer 13 may be formed. The first conductive-type semiconductor layer 11, the active layer 12, and the second conductive-type semiconductor layer 13 may collectively form the light emitting structure 10.

The substrate 5 may include an insulating or conductive substrate. The substrate 5 may include at least one of, for example, sapphire, Al2O3, SiC, GaAs, GaN, ZnO, Si, GaP, InP, and Ge. However, the present disclosure is not limited thereto. Between the first conductive-type semiconductor layer 11 and the substrate 5, at least one of a buffer layer and an un-doped semiconductor layer may be formed.

The semiconductor layer may be deposited or grown on the substrate 5, for example, using MOCVD (Metal Organic Chemical Vapor Deposition), CVD (Chemical Vapor Deposition), PECVD (Plasma-Enhanced Chemical Vapor Deposition), MBE (Molecular Beam Epitaxial), HVPE (Hydride Vapor Phase Epitaxial) etc. However, the present disclosure is not limited thereto.

As an example, the first conductive-type semiconductor layer 11 may include an n-type semiconductor layer with a doped n-type dopant as a first conductive-type dopant. The second conductive-type semiconductor layer 13 may include a p-type semiconductor layer with a doped p-type dopant as a second conductive-type dopant. In another example, the first conductive-type semiconductor layer 11 may include a p-type semiconductor layer, while the second conductive-type semiconductor layer 13 may include an n-type semiconductor layer.

The first conductive-type semiconductor layer 11 may include, for example, an n-type semiconductor layer. The first conductive-type semiconductor layer 11 may include a semiconductor material with a composition of $In_xAl_yGa_{1-x-y}N$ $0 \leq x \leq 1$, $0 \leq y \leq 1$, $0 \leq x+y \leq 1$. The first conductive-type semiconductor layer 11 may include, for example, at least one selected from a group consisting of InAlGaN, GaN, AlGaN, AlInN, InGaN, AlN, InN etc. Further, Si, Ge, Sn, etc. as an n-type dopant may be doped into the first conductive-type semiconductor layer.

The second conductive-type semiconductor layer 13 may include, for example, a p-type semiconductor layer. The second conductive-type semiconductor layer 13 may include a semiconductor material with a composition of $In_xAl_yGa_{1-x-y}N$ $0 \leq x \leq 1$, $0 \leq y \leq 1$, $0 \leq x+y \leq 1$. The second conductive-type semiconductor layer 13 may include, for example, at least one selected from a group consisting of InAlGaN, GaN, AlGaN, InGaN, AlInN, AlN, InN etc. Mg, Zn, Ca, Sr, Ba, etc. as a p-type dopant may be doped into the second conductive-type semiconductor layer 13.

The active layer 12 may refer to a layer in which an electron (or hole) injected from the first conductive-type semiconductor layer 11 encounters a hole (or electron) injected from the second conductive-type semiconductor layer 13, thereby to emit light beams based on an energy band of a material of the active layer 12. The active layer 12 may include any one of a single quantum well, a multi quantum well, a quantum dot, or a quantum wire. However, the present disclosure is not limited thereto.

The active layer 12 may include a semiconductor material with a composition of, for example, $In_xAl_yGa_{1-x-y}N$ $0 \leq x \leq 1$, $0 \leq y \leq 1$, $0 \leq x+y \leq 1$. When the active layer 12 may include a multi quantum well, the active layer 12 may be embodied as vertical alternations of a plurality of well layers and a plurality of barrier layers.

In another example, the first conductive-type semiconductor layer 11 may include a p-type semiconductor layer, while the second conductive-type semiconductor layer 13 may include an n-type semiconductor layer. On the first conductive-type semiconductor layer 13, a further semiconductor layer (not shown) made of an n-type or p-type semiconductor layer may be formed. In this way, the light emitting structure 10 may be formed of at least one of n-p, p-n, n-p-n, and p-n-p junctions. Impurities doping concentrations in the first conductive-type semiconductor layer 11 and the second conductive-type semiconductor layer 13 may be uniform or non-uniform. That is, the light emitting structure 10 may be various. Thus, the present disclosure is not limited thereto.

Further, between the first conductive-type semiconductor layer 11 and the active layer 12 or between the second conductive-type semiconductor layer 13 and the active layer 12, a first conductive-type InGaN/GaN super lattice structure or InGaN/InGaN super lattice structure may be formed. Further, between the second conductive-type semiconductor layer 13 and the active layer 12, a second conductive-type AlGaN layer may be formed.

Subsequently, as shown in FIG. 4, on a top and outer surface of the light emitting structure 10, the first protective layer 25 may be formed. The first protective layer 25 may have an open region defined therein to partially expose the light emitting structure 10. The first protective layer 25 may include an insulating material.

On the exposed top surface of the light emitting structure 10, the contact layer 15 may be formed. Then, on the contact layer 15, the reflection layer 17 may be formed. The reflection layer 17 may have a width larger than a width of the contact layer 15 to completely cover the contact layer 15. In this way, the reflection layer 17 may improve light-beam reflection efficiency. The contact layer 15 may include a metal oxide or metal, and the reflection layer 17 may include a metal material. The contact layer 15 and reflection layer 17 may be formed using a deposition process or plating process.

Referring to FIG. 5, the second protective layer 41 may be partially disposed on the first protective layer 25 in an either left or right outer region. The second protective layer 41 may be further partially disposed on the reflection layer 17. That is, the second protective layer 41 may have the extension part 42 to partially extend on the reflection layer 17. The second protective layer 41 may include an insulating material. In one example, the second protective layer 41 may be formed of a reflection structure as a stack of dielectric layers with different refractive indexes, for example, DBR (Distributed Bragg reflector).

Referring to FIG. 6, on the reflection layer 17, the bonding layer 19A may be formed. On the bonding layer 19A, the conductive support member 21A may be formed. Between the bonding layer 19A and reflection layer 17, a seed layer or diffusion barrier layer may be formed. However, the present disclosure is not limited thereto. The bonding layer 19A may be formed using a deposition process or plating process. The support member 21A may be bonded to the bonding layer 19A. The bonding layer 19A may be disposed on the reflection layer 17, the second protective layer 41, and the first protective layer 25.

Referring to FIG. 6 and FIG. 7, the recess 44 may vertically partially pass through the support member 21A to partially overlap the second protective layer 41, to be specific, the extension part 42. In other words, the recess 44 may be disposed to vertically and partially pass through the support member 21A and bonding layer 19A to partially expose the second protective layer 41, to be specific, the extension part 42. In this connection, the recess 44 may be formed using an irradiation of a laser having a specific wavelength into the support member 21A. In this connection, the second protective layer 41 may act to reflect a laser having a specific wavelength using dielectric layers with different refractive indexes. In this way, the second protective layer 41 may protect the underlying reflection layer 17 or contact layer 15 or light emitting structure 10.

The recess 44 may divide the support member 21A into the first and second support members 21 and 31 and may divide the bonding layer 19A into the first and second bonding layers 19 and 29. Further, the first electrode 20 may include the contact layer 15, reflection layer 17, first bonding layer 19, and first support member 21, while the second electrode 30 may include the second bonding layer 29 and second support member 31.

Referring to FIG. 8, the recess 44 may be filled with the insulating layer 45. The insulating layer 45 may allow an electrical isolation between the first and second support member 21 and 31, and between the first and second bonding layer 19 and 29.

FIG. 9 indicates an upside down of FIG. 8, where the substrate 5 is removed from the light emitting structure 10. In one example, the substrate 5 may be removed using a LLO (Laser Lift Off) process. The LLO process may refer to a process to irradiate a laser to a bottom surface of the grown substrate 5 to allow a separation between the substrate 5 and the light emitting structure 10. The substrate 5 may not be removed. Alternatively, the substrate 5 may be partially removed only at a portion contacting the connection electrode 51, while a rest thereof may remain on the light emitting structure 10. Such a substrate 5 may include a light-transparent material.

Further, an isolation etching may be applied to each of outer regions A1 of individual light emitting structures 10 to divide the light emitting structure 10 into multiple individual light emitting structures corresponding to multiple individual light emitting devices respectively. The isolation etching may be performed, for example, using a dry etching such as an ICP (Inductively Coupled Plasma) process. However, the present disclosure is not limited thereto. That is, each outer region A1 of each light emitting structure 10 may be etched away. In this connection, an outer portion of the first protective layer 25 may be exposed. Further, the first conductive-type semiconductor layer 11 have an unevenness 11A on a top surface thereof. In this way, the first conductive-type semiconductor layer 11 may improve light-beam extraction therethrough toward the outside of the device.

As shown in FIG. 9 and FIG. 10, on the light emitting structure 10, the third protective layer 95 may be formed. The third protective layer 95 may be partially disposed on a top surface of the light emitting structure 10 may be further disposed on a side wall thereof. However, the present disclosure is not limited thereto. The third protective layer 95 may include an insulating material, and may contact the first protective layer 25.

Then, the electrode recess 34 may be disposed by an etching process from one side outer region of the light emitting structure 10. The electrode recess 34 may be disposed by partially and vertically etching away the first protective layer 25 into the second bonding layer 29. Then, the electrode recess 34 may be filled with the connection electrode 51. Further, the connection electrode 51 may vertically extend along a side wall of the light emitting structure 10 and horizontally to a top surface of the first conductive-type semiconductor layer 11.

In this way, the first conductive-type semiconductor layer 11 may be electrically connected via the connection electrode 51 to the second support member 31. Further, the second conductive-type semiconductor layer 13 may be electrically connected via the contact layer 15 to the first support member 21. This light emitting device may dispense with a wire bonding process since a power may be supplied thereto via the underlying first and second support members 21 and 31.

FIG. 11 is a side cross-sectional view of a light emitting device in accordance with a second embodiment. When describing the light emitting device in accordance with a second embodiment in FIG. 11, the same components and configurations as those in FIG. 1 may be removed for the sake of clarity of the description.

Referring to FIG. 11, a light emitting device may include a first pad 22 under the first support member 21, and a second pad 32 under the second support member 31. The first and second pads 22 and 32 may include different materials from those of the first and second support members 21 and 31 respectively. For example, each of the first and second pads 22 and 32 may include at least one of Au, Ni, Al, Ti, and AuSn. However, the present disclosure is not limited thereto. Between and into the first and second pads 22 and 32, the insulating layer 45 may further partially extend to form a portion 45A thereof. However, the present disclosure is not limited thereto. The portion 45A of the insulating layer 45 may partially contact the first and second support members 21 and 31 on the bottom surfaces thereof. The portion 45A of the insulating layer 45 may have a width larger than a width of the portion of the insulating layer 45 between the first and second support members 21 and 31.

FIG. 12 is a side cross-sectional view of a light emitting device in accordance with a third embodiment. When describing the light emitting device in accordance with a third embodiment in FIG. 12, the same components and configurations as those in FIG. 1 and FIG. 2 may be referred to the descriptions with reference to FIG. 1 and FIG. 2.

Referring to FIG. 12, the light emitting device may include the first electrode 20 and second electrode 30 under the light emitting structure 10 in the first region and second region respectively. The first electrode 20 may have the configuration as shown in FIG. 1. The second electrode 30 may include the second bonding layer 29 and second support member 31. The second bonding layer 29 may extend upward to replace an outer portion of the second protective layer 41 therewith and to contact the bottom surface of the first protective layer 25, thereby to form an upper portion 29A. The upper portion 29A of the second bonding layer 29 may have a top level higher than a bottom level of the reflection layer 17. The second contact 53 of the connection electrode 51 may be disposed between the second protective layer 41 and the upper portion 29A of the second bonding layer 29. That is, the second contact 53 of the connection electrode 51 may contact the upper portion 29A of the second bonding layer 29, thereby to realize an electrical connection between the second support member 31 and first conductive-type semiconductor layer 11.

FIG. 13 is a side cross-sectional view of a light emitting device in accordance with a fourth embodiment. When describing the light emitting device in accordance with a fourth embodiment in FIG. 13, the components and configurations as defined above may be referred to the above descriptions.

Referring to FIG. 13, the first contact 52 of the connection electrode 51 may be electrically connected to the first conductive-type semiconductor layer 11. The side wall of the second contact 54 may be exposed together with the side wall of the second electrode 30. The second contact 54 of the connection electrode 51 may contact the second bonding layer 29 of the second electrode 30. The second bonding layer 29 of the second electrode 30 may have a step structure 34A in an outmost region. On the step structure 34A, the second contact 54 of the connection electrode 51 may be disposed. It may dispense with a separate electrode recess. The step structure 34A may be defined by a side wall and a bottom outmost surface of the second bonding layer 29. The second contact 54 of the connection electrode 51 may be disposed on side walls of the first and second protective layers 25 and 41 and the second bonding layer 29.

FIG. 14 is a side cross-sectional view of a light emitting device in accordance with a fifth embodiment. When describing the light emitting device in accordance with a fifth embodiment in FIG. 14, the components and configurations as defined above may be referred to the above descriptions.

Referring to FIG. 14, a plurality of second electrodes 30 and 30A may be disposed under the light emitting structure 10 in outer first and second regions thereof respectively. The first electrode 20 may be disposed under the light emitting structure 10 between the outer first and second regions thereof.

The first electrode 20 may be disposed between the plurality of the second electrodes 30 and 30A. The first electrode 20 may contact a bottom surface of the light emitting structure 10. The first bonding layer 19 of the first electrode 20 may have an upward protrusion 19D which may be electrically connected to the contact layer 15 and reflection layer 17 under the light emitting structure 10. The upward protrusion 19D of the first bonding layer 19 of the first electrode 20 may be further electrically connected to the reflection layer 17 via the extension part 42 of the second protective layer 41. The upward protrusion 19D of the first bonding layer 19 may upwardly protrude through a recess defined between both extension parts 42 of the second protective layer 41 to contact the reflection layer 17.

Each of the plurality of second electrodes 30 and 30A may include the second bonding layer 29 and second support member 31, and may be electrically connected via the first and second connection electrodes 51 and 51A respectively to different outer top surface portions of the first conductive-type semiconductor layer 11.

The insulating layers 45 and 45B may be disposed between the plurality of the second electrodes 30 and 30A and the first electrode 20, respectively, thereby to allow electrical separations between the plurality of the second electrodes 30 and 30A and the first electrode 20. The plurality of second electrodes 30 and 30A may act as a selective power supply path.

FIG. 15 is a side cross-sectional view of a light emitting device in accordance with a sixth embodiment. When describing the light emitting device in accordance with a sixth embodiment in FIG. 15, the components and configurations as defined above may be referred to the above descriptions.

Referring to FIG. 15, the light emitting device may have a connection electrode 55 with a different structure from that of the connection electrode in FIG. 1. In this connection, the connection electrode 55 may inwardly extend beyond the side wall of the light emitting structure 10 to replace a portion of the first conductive-type semiconductor layer 11 therewith. Thus, the connection electrode 55 may partially contact the first conductive-type semiconductor layer 11 on the bottom surface thereof. Further, a portion 95A of the third protective layer 95 may be disposed between the connection electrode 55 and the light emitting structure 10. Thus, the portion 95A of the third protective layer 95 may act to realize a separation between the active layer 12, and second conductive-type semiconductor layer 13 and the connection electrode 55. In this way light, the connection electrode 55 may not be disposed on a top surface of the emitting structure 10, thereby to improve light extraction efficiency. The inward extension of the connection electrode 55 into the light emitting structure 10 may partially and vertically overlap the first conductive-type semiconductor layer 11. The connection electrode 55 may have an inner side wall contacting an outer side wall of the portion 95A of the third protective layer 95. The contact 56 of the connection electrode 55 may contact at least one of the second support member 31, and second bonding layer 29.

FIG. 16 is a side cross-sectional view of a light emitting device package including the light emitting device in FIG. 1.

Referring to 16, the light emitting device package may include a body 101, a first lead electrode 121 and second lead electrode 123 in the body 101, the above-disclosed light emitting device 100 provided in the body 101 to be electrically connected to the first lead electrode 121 and second lead electrode 123, and a molding member 131 to enclose the light emitting device 100.

The body 101 may include a silicon material, synthetic resin material, or metal material, and may have a cavity 103 defined therein to receive the light emitting device 100. The cavity 103 may have both tilted side surfaces.

The first lead electrode 121 and second lead electrode 123 may be electrically isolated from each other. The first lead electrode 121 and second lead electrode 123 may act to supply the power to the light emitting device 100. Further, the first lead electrode 121 and second lead electrode 123 may act to reflect light-beams generated from the light emitting device 100 to improve a light-beam efficiency. Further, the first lead electrode 121 and second lead electrode 123 may act to discharge a heat generated from the light emitting device 100 out of the package.

The first and second support members 21 and 31 of the light emitting device 100 in FIG. 1 may be disposed on the first lead electrode 121 and second lead electrode 123 respectively. The first and second support members 21 and 31 may be die-bonded to the first lead electrode 121 and second lead electrode 123 respectively via a conductive adhesive (not shown). Alternatively, the light emitting device 100 may be disposed on only one of the first and second support members 21 and 31, while the other of the first and second support members 21 and 31 not disposed on the light emitting device 100 may be electrically connected to the light emitting device 100 via a wire, etc. However, the present disclosure is not limited thereto.

The molding member 131 may enclose and protect the light emitting device 100. Further, the molding member 131 may contain a fluorescent material to change a wavelength of a light beam emitted from the light emitting device 100.

A plurality of the above-disclosed light emitting devices or light emitting device packages may be arranged in an array on a substrate. The light emitting device package may have various optics, for example, a lens, light guide plate, prism sheet, diffusion sheet, etc. in a light-beam path. The light emitting device package, substrate, and optics may collectively form a lighting device. This lighting device may be implemented as a top view or side view type and may be incorporated in a display of a portable device such as a notebook, or may be applied to an illumination device or indication device, etc. In another embodiment, the above-disclosed light emitting device or light emitting device package may be implemented as an illumination device, for example, a lamp, street light, electric signboard, headlight, etc.

Example embodiments have been described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

Examples of various embodiments are illustrated and described further under. It will be understood that the description herein is not intended to limit the claims to the specific embodiments described. On the contrary, it is intended to cover alternatives, modifications, and equivalents as may be included within the spirit and scope of the present disclosure as defined by the appended claims.

INDUSTRIAL APPLICABILITY

The above embodiments may improve reliability of light emitting device.

The light emitting devices of the above embodiments may be used as an illumination device, for example, a lamp, street light, electric signboard, headlight, etc. including the LED.

The invention claimed is:
1. A light emitting device comprising:
a light emitting structure comprising a first conductive-type semiconductor layer, an active layer under the first conductive-type semiconductor layer, and a second conductive-type semiconductor layer under the active layer;
a first electrode disposed under a first region of a bottom surface of the light emitting structure and electrically connected to the second conductive-type semiconductor layer;
a second electrode disposed under a second region of the bottom surface of the light emitting structure and electrically connected to the first conductive-type semiconductor layer;
a connection electrode electrically connected between the second electrode and the first conductive-type semiconductor layer;
an insulating layer disposed between the first and second electrodes;
a first protective layer disposed around an outer periphery of the bottom surface of the light emitting structure; and
a second protective layer disposed between the insulating layer and the light emitting structure,
wherein the second protective layer is disposed on the insulating layer and has a width larger than a width of the insulating layer in a first direction,
wherein the second protective layer is formed of an insulating material, and
wherein a bottom surface of the connection electrode is disposed a lower position than that of a top surface of the insulating layer.

2. The device of claim 1, wherein the first electrode comprises:
a contact layer disposed under the second conductive-type semiconductor layer;
a reflection layer disposed under the contact layer;
a first bonding layer disposed under the reflection layer; and
a first conductive support member disposed under the first bonding layer.

3. The device of claim 2, wherein the second electrode comprising:
a second bonding layer disposed under the second protective layer; and
a second conductive support member disposed under the second bonding layer.

4. The device of claim 3, wherein the insulating layer is disposed between the first and second conductive support members and between the first and second bonding layers.

5. The device of claim 4, wherein the insulating layer has a bottom level flush with bottom levels of the first and second conductive support members.

6. The device of claim 4, wherein the second protective layer has an extension part between the first and second bonding layers and the reflection layer, and wherein a bottom surface of the second electrode has an area smaller than an area of a bottom surface of the first electrode.

7. The device of claim 4, wherein the connection electrode contacts a surface of the first conductive-type semiconductor layer.

8. The device of claim 4, wherein the connection electrode contacts an inner region of a bottom surface of the first conductive-type semiconductor layer.

9. The device of claim 7, wherein the connection electrode has a bottom contacting at least one of the second bonding layer and second support of the second electrode, and wherein the bottom surface of the connection electrode is disposed a lower position than that of a bottom surface of the reflection layer.

10. The device of claim 4, wherein the second protective layer includes a reflection structure formed of a stack of dielectric layers with different refractive indexes.

11. The device of claim 4, wherein the second electrode is plural, wherein the plurality of the second electrodes are disposed under the light emitting structure in a plurality of different regions thereof respectively.

12. The device of claim 11, wherein the first electrode is disposed between the second electrodes.

13. The device of claim 4, wherein the insulating layer has a top portion contacting the reflection layer.

14. The device of claim 4, wherein the first support member has a bottom surface width larger than a bottom surface width of the second support.

15. A light emitting device comprising:
a light emitting structure comprising a first conductive-type semiconductor layer, an active layer under the first conductive-type semiconductor layer, and a second conductive-type semiconductor layer under the active layer;
a contact layer disposed under the second conductive-type semiconductor layer;
a reflection layer disposed under the contact layer;
a first bonding layer disposed under a first region of the reflection layer and electrically connected to the reflection layer;
a second bonding layer disposed under a second region of the reflection layer and spaced from the first bonding layer and the reflection layer;
a first protective layer disposed between the reflection layer and the second bonding layer;
a first conductive support member disposed under the first bonding layer;
a second conductive support member disposed under the second bonding layer; and
a connection electrode electrically connected between the second bonding layer and the first conductive-type semiconductor layer,
wherein the first and second support members have different widths and the same thickness,
wherein a bottom surface of the second support member has an area smaller than area of a bottom surface of the first support member.

16. The device of claim 15, further comprising a second protective layer disposed around an outer periphery of a bottom surface of the second conductive-type semiconductor layer, wherein the first bonding layer contact a bottom surface of the second protective layer.

17. The device of claim 16, wherein the connection electrode has a lower portion contacting the first protective layer, the first protective layer and the second bonding layer.

18. The device of claim 17, wherein the second bonding layer vertically overlaps the light emitting structure, the contact layer and the reflection layer.

19. The device of claim 17, wherein the first protective layer includes a reflection structure formed of a stack of different dielectric layers.

20. A light emitting device package comprising:
a body;
first and second lead electrodes disposed on the body; and
the light emitting device of claim 3, wherein the first and second supports of the first and second electrodes of the light emitting device are connected to the first and second lead electrodes respectively.

* * * * *